United States Patent [19]

Lindmayer

[11] 4,169,739
[45] Oct. 2, 1979

[54] METHOD OF MAKING SILICON-IMPREGNATED FORAMINOUS SHEET BY PARTIAL IMMERSION AND CAPILLARY ACTION

[75] Inventor: Joseph Lindmayer, Bethesda, Md.

[73] Assignee: Semix, Incorporated, Rockville, Md.

[21] Appl. No.: 895,814

[22] Filed: Apr. 12, 1978

[51] Int. Cl.² ............... H01L 21/208; H01L 21/84; H01L 27/14
[52] U.S. Cl. .................. 148/1.5; 29/572; 136/89 TF; 148/171; 148/174; 156/DIG. 88; 357/4; 357/59; 357/30; 427/58; 427/74; 427/86; 427/113; 427/431; 427/434 R; 428/408; 428/446
[58] Field of Search ............... 148/1.5, 174, 171; 156/622, 624, DIG. 84, DIG. 88; 136/89 TF; 427/58, 74, 86, 113, 431, 432, 434; 29/572; 264/105; 428/408, 446; 357/4, 59, 30

[56] References Cited

U.S. PATENT DOCUMENTS

| 2,840,489 | 6/1958 | Kempter et al. ............... 427/86 |
| 3,078,328 | 2/1963 | Jones ................... 148/174 X |
| 3,632,444 | 1/1972 | Grotheer et al. ............... 427/113 |
| 3,729,342 | 4/1973 | Te Velde ................ 427/74 X |
| 3,770,488 | 11/1973 | Pepper et al. ............... 427/432 X |
| 3,860,443 | 1/1975 | Lachman et al. ............... 427/113 X |
| 3,969,163 | 7/1976 | Wakefield ............... 148/174 |
| 4,027,053 | 5/1977 | Lesk ................... 427/86 X |
| 4,032,371 | 6/1977 | Andersen ............... 148/1.5 X |

OTHER PUBLICATIONS

Heaps et al., "Dip-Coated Sheet Silicon Solar Cells", Conf. Record, 12th IEEE Photo-Voltaic Specialist Conf., Nov. 15-18, 1976, pp. 147-150.
Zoutendyk, J. A., "Development of Low-Cost Silicon ... Solar Energy Conversion", Int. Solar Energy Society Conf., Aug. 16-20, 1976, pp. 1-14.
Ciszek et al., "Inexpensive Silicon Sheets for Solar Cells", NASA Tech. Briefs, Winter 1977, vol. 2, No. 4, pp. 432-433.

*Primary Examiner*—R. Dean
*Assistant Examiner*—W. G. Saba
*Attorney, Agent, or Firm*—Watson, Cole, Grindle & Watson

[57] ABSTRACT

A foraminous sheet of carrier substrate is contacted, by full or partial immersion, with a bath of molten silicon to form a sheet of material in which the foramina are filled with silicon and at least one surface of the sheet is coated with silicon. The coated sheet is suitable for use in forming a photovoltaic cell.

8 Claims, 3 Drawing Figures

METHOD OF MAKING SILICON-IMPREGNATED FORAMINOUS SHEET BY PARTIAL IMMERSION AND CAPILLARY ACTION

The present invention relates in general to a silicon body adapted to be formed into a photovoltaic cell, and a method of making that body. More particularly, it relates to silicon articles in which the silicon is formed from a molten bath and in which the resultant body, rather than being purely monocrystalline, is formed from crystallites of silicon.

Historically, solar cells employing the photovoltaic effect in which radiant energy from the sun is directly transduced into a flow of electrons, have employed single-crystal, or semi-conductor grade silicon as a basic material in producing those silicon solar energy cells. The expense of the monocrystalline silicon that is used to form photovoltaic cells is probably the most cost-determinative factor in the entire production of a solar cell. For example, at the present time, the cost of monocrystalline silicon in ingot form is about $300 per kilogram, which makes it an important factor in the cost of the cell as a whole.

Typically, single-crystal silicon is produced by either the Czochralski (CZ) or float zone (FZ) method. When the CZ method is used, molten silicon is seeded, then the seeded silicon is extended by a crystal pulling machine. The FZ process, zones of a silicon ingot are melted by passing the ingot back and forth through a localized heater. Because of the difficulty and expense inherent in both of these methods of creating single-crystal silicon, the cost of such silicon, as stated, is quite high. Thus, silicon solar cells are relatively expensive, at least when the output of those cells is compared with utility power.

As particularly disclosed in my copending application Ser. No. 751,342, filed Dec. 16, 1976 and entitled, Method of Producing Semicrystalline Silicon and Product Formed Thereby, it has now been found that quite satisfactory efficiencies for silicon solar energy cells may be achieved when silicon of a high degree of crystallographic order is utilized, although such order is not of that degree of perfection equalled by monocrystalline silicon. When the crystallographic order of the silicon is defined by relatively large grains or crystallites, efficiencies can be achieved for solar cells formed from such semicrystalline silicon which, while they may not always be the equal of those made from monocrystalline silicon, are so slightly inferior that the market cost differential between monocrystalline and semicrystalline silicon makes the use of the semicrystalline silicon highly cost-effective. Particularly in terrestrial cells, cost is an important factor in determining whether a photovoltaic cell will be considered an oddity or whether it will find practical use in which, depending on the particular circumstances of that use, it holds a definite advantage over electricity produced from fossil fuels.

One method that has been utilized in the past in an effort to form a ribbon or thin sheet of silicon directly from a molten bath has been that in which the molten silicon is drawn from a bath through a die. While this attempt has achieved some popularity, at least in terms of the hope that it may ultimately prove to be economically feasible, all such efforts have been met with the major difficulty of attempting to minimize the interaction of silicon and the die. The development of a die that wll not interact with molten silicon has consumed years of work; it is my understanding that the problem has still not been resolved. It will be appreciated that the temperature at which silicon is in a freely molten state is at or in excess of 1,410° C., the melting point of silicon. At and above such temperatures, silicon will either react with or form eutectic compositions with many metals. Consequently, a die that can be used to form a silicon ribbon of a particular shape must be made of a material that will neither react with nor form a eutectic composition with molten silicon. This is one difficulty inherent in drawing a ribbon of silicon through a die.

The present invention is based on the discovery that either partial or complete immersion of a sheet of carrier substrate, for example, a woven graphite cloth, which sheet has foramina capable of holding the molten silicon, will form a silicon body that is adapted to be made into solar cells. The silicon that solidifies from the molten silicon will not be in monocrystalline form; yet, when cooled slowly, it will be in the form of relatively large crystallites and, as has been shown in said copending application, those crystallites can be utilized to form photovoltaic cells. Said copending patent application is incorporated by reference herein to any extent required to complete the present disclosure.

I have now discovered that when a particular criterion is met, silicon that is impregnated into a foraminous body, such as a graphite cloth, will be suitable for use in forming photovoltaic cells. The criterion is that the cloth or other foraminuous body not only have the silicon in the interstices of the carrier, but that the carrier further have a coating of at least about ten microns in thickness on one surface thereof. When cooled from a molten bath, the silicon will be in the form of crystallites. As stated, this form of silicon is definitely useful. Moreover, by having a coating of silicon in addition to having the silicon fill the interstices of the cloth, there will be a zone of silicon that is substantially free of the cloth or other sheet material. It is this zone of silicon that is especially useful in collecting photogenerated carriers.

In concise summary, then, the present invention is, as an article of manufacture, a body of cooled, formerly molten silicon comprised of a sheet of material that is capable of maintaining its structural integrity in the presence of molten silicon, such sheet having foramina along its surface. The foramina are filled with silicon and the silicon forms a surface zone at least about ten microns in thickness that overlies an inner zone comprised of silicon and the carrier substrate. Preferably, the depth of the surface zone is greater than ten microns, e.g., one mil, and most preferably it is three mils or more in thickness.

With respect to the method of making the aforesaid silicon-impregnated body, in broad terms the body is formed by contacting a bath of molten silicon with a foraminous carrier substrate that is capable of maintaining its structural integrity presence of the molten silicon. The sheet is maintained in contact with the bath until the foramina of the sheet have been filled with silicon and at least a portion of one surface of the sheet has been coated with silicon, minimally to a depth of about ten microns. Then the foraminous sheet is removed from its contact with the molten bath and cooled. Although other methods of impregnating the foraminous body may be apparent, the two basic methods that I presently have found viable are contacting the bath of molten silicon with the sheet of foraminous material, either with complete or partial immersion of the carrier sheet. When immersion is complete, the sheet may be passed into and out of the bath, then cooled. Where immersion is only partial, one portion of the sheet may be dipped in the molten silicon bath and other regions of this sheet are then impregnated and coated by capillary action of the molten silicon.

With respect to carrier materials, graphite cloth has been found to be appropriate; however, glass fibers, quartz fibers and asbestos fibers, as well as perforated ceramic sheets have been found suitable. Also, so-called refractory metals may be used. After the immersion or dip in the molten silicon bath and subsequent cooling, a photovoltaic junction can be formed at the surface of silicon body by diffusion or other procedures, such surface defining one side of the surface zone. The photovoltaic junction so formed will be located in the surface zone of the silicon body and will, therefore, lie between the inner zone of the body and the surface thereof.

The provision of a surface zone is an important feature of the present invention. The present invention contemplates avoiding any possible interference by the carrier material of the essential photovoltaic function of a cell made from the silicon body according to the present invention by having much of the photovoltaic function take place away from the carrier, i.e., in the surface zone. When, for example, the molten silicon body has been doped with an impurity of one conductivity type, and subsequently the cooled silicon body is subjected to diffusion with an impurity of another conductivity type, a photovoltaic junction will be formed in the surface zone of the silicon body. In such zone, the junction will not be in contact with or interrupted by the sheet material. When a unit of radiant energy contacts the surface zone to form electron-hole pairs in the silicon, the electrons, e.g., in an n-p cell, will be attracted to the front junction. Depending on the depth of the surface zone and the depth of penetration of the light energy, those electrons can be substantially uninhibited by the carrier from which the silicon body has been formed. While the holes will now pass to the back surface of the silicon body, the obstruction of their passage by the material from which the sheet is made will not be significant.

The prime object of the present invention, therefore, will be apparent: to form a far less expensive silicon solar cell from silicon that is other than monocrystalline, by a method that is simple and economical. Indeed, when the complete immersion variation of my inventive method is utilized, the formation of a silicon body can even be continuous. The hallmark of the present method and product is that the silicon body so formed is far less expensive than, e.g., monocrystalline silicon. In addition, the product is already in sheet form and can be processed directly into solar cells rather than sliced from an ingot.

These and other objects, features and advantages of the present inventive method and product will become more apparent when considered in conjunction with illustrations of preferred embodiments of such method and product in the accompanying drawing, which forms a part hereof and in which.

Figure 1:
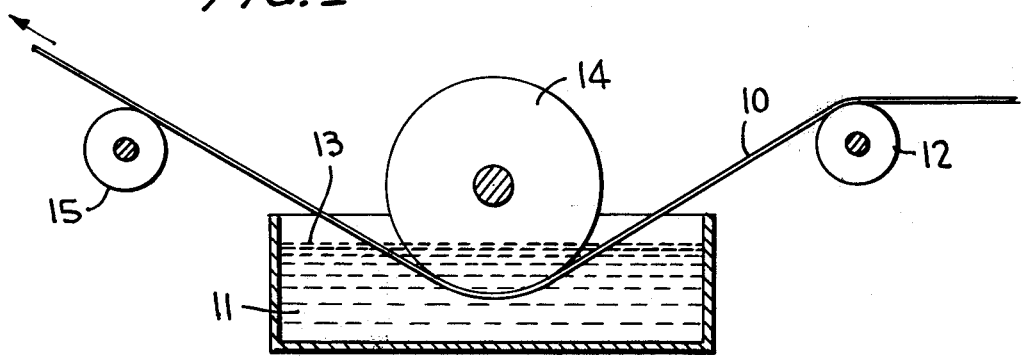
FIG. 1 is a schematic illustration of a preferred process according to the present invention in which the foraminous sheet is completely immersed in a bath of molten silicon.

As presently contemplated, a preferred embodiment of a method according to my invention is illustrated schematically in FIG. 1 of the drawing. That figure shows the foraminous sheet 10, which preferably is in the form of a graphite cloth or ribbon, in a bath of molten silicon 11. As shown in FIG. 1, the graphite cloth 10 passes over an entry roll 12 and below the surface 13 of molten silicon bath 11, being caused to submerge by means of an immersion roll 14 so mounted that, when the ribbon 10 is fed beneath the surface of immersion roll 14, it likewise passes beneath the surface 13 of the molten silicon bath 11. Immersion roll 14 may be powered to assist in positive movement of the ribbon through the bath. The immersion roll may be omitted and the weight of the ribbon relied on to maintain the carrier in the bath. From the bath 11, the ribbon passes over the surface of takeoff roll 15, at which point it has cooled and solidified.

Figure 2:
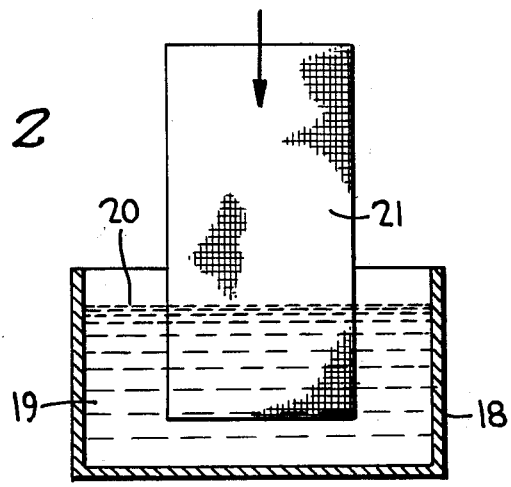
FIG. 2 is a schematic illustration of a process according to the present invention in which the foraminous sheet is partially immersed in a bath of molten silicon.

Another embodiment of the method of the invention has been illustrated in FIG. 2. Here, a crucible 18 holds a bath 19 of molten silicon having a surface 20. A woven cloth ribbon 21, which may be graphite, is partially immersed in the bath 19 and beneath the surface 20 thereof. Within a period of a minute in such position, it was observed that molten silicon had impregnated the woven cloth and filled the foramina where the ribbon 21 extended beneath the surface 20 of the bath 19 of the molten silicon. Further, by capillary action the molten silicon had been drawn up into foramina of the woven structure located above the surface of the bath. After such capillary action had taken effect, the graphite ribbon was removed from the bath and permitted to cool. It will be apparent that where partial immersion, such as is illustrated in FIG. 2 is utilized, the process according to my invention is a batch process. A total immersion procedure such as that illustrated in FIG. 1 of the drawing is a continuous process and thus is more likely to lend itself to commercial use.

Figure 3:
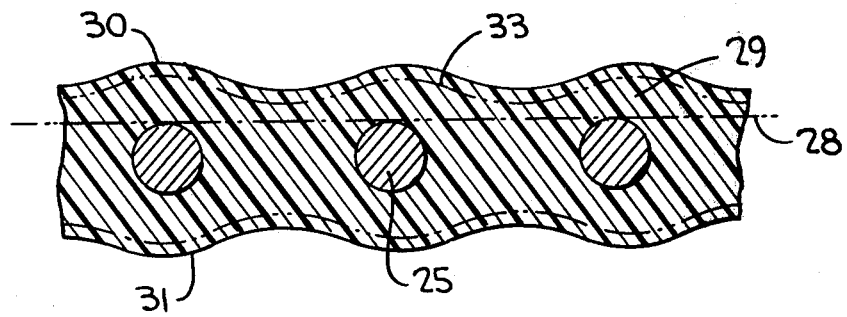
FIG. 3 is a cross-sectional view diagrammatically showing a foraminous sheet that has been impregnated with molten silicon in accordance with the processes of FIGS. 1 or 2.

Illustrated in FIG. 3 is an embodiment of a silicon-impregnated, woven ribbon, taken in cross-section, produced by practice of the process of FIG. 1, although it can also represent a graphite ribbon that has been partially immersed in a bath of molten silicon in accordance with the process of FIG. 2. As shown, the graphite woven cloth illustrated in FIG. 3 has warp or weft strands 25. These strands cross (not shown) to form foramina or interstices. After immersion in the molten silicon which, after solidification, is substantially semi-crystalline in structure, i.e., it is formed from crystallites having an average mean diameter of perhaps 1 to 10 millimeters.

As indicated by broken lines 28, the original front surface of the ribbon prior to impregnation has overlying it a coating 29 of silicon that is about 3 mils in thickness. The former back surface of the ribbon has a similar coating of solidified silicon overlying it. With the ribbon so impregnated, it is now suitable for the formation of a photovoltaic junction therein.

According to my preferred embodiment, the silicon in its molten form has been doped with an impurity of one conductivity type, in this case, boron. The impregnated ribbon with its surface zone 29 extending from broken line 28 to the front surface 30 is subjected to diffusion by an impurity of an opposite conductivity type, in this case, phosphorus. Known diffusion techniques can be employed. After diffusion with a phosphorus containing compound, a photovoltaic junction indicated by broken line 33, has been formed just beneath the surface 30 of the surface zone 29. In the case of the impurities referred to, that photovoltaic junction will be an n-p junction.

The photovoltaic effect has been demonstrated in such a ribbon or carrier, although it will normally be found more productive to subdivide the ribbon transversely into segments to form a plurality of individual solar cells from it. However, with an impregnated carrier such as that illustrated in FIG. 3, light impinging on the surface 30 of the surface zone 29 will generate electron-hole pairs. Since the photovoltaic junction is an n-p junction, the electrons will be attracted to the n-p junction 33 and therefrom to electrically conductive grids (not shown) on surface 30. The holes will then be directed toward the bottom surface 31 of the device, which may have been alloyed with aluminum in a conventional manner. While the hole will have to travel around the graphite fibers 25, it has been found that the holes will be able to do so without undue difficulty. Since the interstices of the ribbon are filled with silicon, there is a silicon continuum through which the holes can travel to the back surface, after which they will likewise be conducted away by the alloyed metal.

Thus, it will be recognized that the generation of electrons in this embodiment takes place to a large extent within the zone or layer 29 adjoining the upper surface 30 of the ribbon. The electrons move in that layer to the junction 33. As a consequence, although the strands of which the impregnated ribbon is composed may have the potential for interference with the flow of electrons, that interference is curcumvented because the electrons do not contact the strands in their passage to the junction 33.

With respect to the material from which the carrier may be formed, the basic requirement is that it be capable of maintaining its structural integrity for the period of time it is in contact with the silicon in its molten form. Even when an extensive reaction takes place between the silicon and the carrier material, that will not necessarily make the material unsuitable. Thus, preferred materials are graphite and fibers such as glass, silica, alumina and silica/alumina, and perforated ceramics. Also, so-called refractory metals, e.g., chromium, tantalum, titanium and vanadium, are useful in this regard. In general, the shorter the period of contact of the carrier material with the molten silicon, the wider the scope of materials that will be able to maintain their structural integrity.

It will be appreciated that while the present invention has been described and illustrated with respect to preferred embodiments thereof, certain modifications, alterations and substitutions will be apparent to those of skill in this art. As to all such substitutions, modifications and alterations, it is intended that they fall within the purview of the present invention, which is to be defined only by the scope including equivalents, of the following, appended claims.

I claim:

1. A method of forming a silicon body suitable for use in making photovoltaic devices, comprising
   (a) contacting a bath of molten silicon with a foraminous carrier of material that is capable of maintaining its structural integrity in the presence of molten silicon, said contacting comprising the step of partially immersing said carrier in said bath, so as to allow at least a portion of one surface of said carrier to be coated with silicon by capillary action of said molten silicon,
   (b) maintaining said carrier in contact with said bath until foramina of said carrier have been filled with silicon and said portion of one surface of said carrier has been coated with silicon,
   (c) removing said carrier from contact with said bath, and
   (d) cooling said carrier and said molten silicon to form a silicon body having a surface zone of silicon and an inner zone comprised of silicon and said carrier, said surface zone being substantially free of said carrier and having a depth of at least about ten microns.

2. A method as claimed in claim 1, including the further step of applying a photovoltaic junction to said cooled body, said junction being located in said surface zone.

3. A body as claimed in claim 1, in which said carrier material is graphite.

4. A body as claimed in claim 1, in which said carrier material is a refractory metal.

5. A body as claimed in claim 1, in which said carrier material is selected from the group consisting of glass fibers, silica fibers, alumina fibers, and silica/alumina fibers.

6. A body as claimed in claim 1, in which said carrier material is a perforated ceramic sheet.

7. A body as claimed in claim 1, in which said surface zone has a depth of at least about one mil.

8. A body as claimed in claim 1, in which said surface zone has a depth of at least about three mils.

* * * * *